(12) United States Patent
Ishida (10) Patent No.: US 10,915,032 B2
(45) Date of Patent: Feb. 9, 2021

(54) CLEANING APPARATUS, IMPRINT APPARATUS, LITHOGRAPHY APPARATUS, AND CLEANING METHOD

(71) Applicant: CANON KABUSHIKI KAISHA, Tokyo (JP)

(72) Inventor: Shingo Ishida, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 67 days.

(21) Appl. No.: 16/454,599

(22) Filed: Jun. 27, 2019

(65) Prior Publication Data

US 2020/0026204 A1 Jan. 23, 2020

(30) Foreign Application Priority Data

Jul. 20, 2018 (JP) ................. 2018-136926

(51) Int. Cl.
*G03F 7/20* (2006.01)
*B08B 15/04* (2006.01)
(Continued)

(52) U.S. Cl.
CPC ........ *G03F 7/70925* (2013.01); *B08B 7/0035* (2013.01); *B08B 15/04* (2013.01);
(Continued)

(58) Field of Classification Search
CPC .......... G08B 7/035; G08B 7/005; G08B 7/00; G08B 15/04; H01L 2237/335; G03F 7/0002; G03F 7/7085; G03F 7/70858; G03F 7/70866; G03F 7/70908; G03F 7/70916; G03F 7/70925; G03F 7/70983; G03F 7/70991; G03F 7/70283; G03F 7/7045; G03F 7/7035; G03F 7/70508; G03F 7/70533; G03F 7/70541; G03F 7/70741; G03F 1/0092; G03F 1/72; G03F 1/82; G03F 1/84; G03F 1/38; G03F 1/42; G03F 1/44;
(Continued)

(56) References Cited

U.S. PATENT DOCUMENTS 10,303,050 B2 5/2019 Sato
2006/0227307 A1* 10/2006 Tel .................. G03F 9/7034
355/53
(Continued)

FOREIGN PATENT DOCUMENTS

JP 2009016434 A 1/2009
JP 2010093245 A 4/2010
(Continued)

*Primary Examiner* — Christina A Riddle
(74) *Attorney, Agent, or Firm* — Rossi, Kimms & McDowell LLP (57) ABSTRACT

To provide a cleaning apparatus advantageous for cleaning, for example, an original plate used to transfer a pattern to a substrate.
Provided is a cleaning apparatus that cleans an original plate used when a pattern is transferred to a substrate, the cleaning apparatus including a region dividing unit which divides the original plate into a plurality of regions on the basis of information of the original plate, a conditions generator which generates cleaning conditions for each of the separate regions, and a cleaner which cleans the original plate on the basis of the cleaning conditions.

14 Claims, 5 Drawing Sheets

(51) Int. Cl.
  *B08B 7/00* (2006.01)
  *G03F 7/00* (2006.01)
(52) U.S. Cl.
  CPC .......... *G03F 7/0002* (2013.01); *G03F 7/7035* (2013.01); *G03F 7/70508* (2013.01); *G03F 7/70533* (2013.01); *G03F 7/70541* (2013.01)
(58) Field of Classification Search
  CPC ........ G03F 1/68; G03F 7/2014; G03F 9/7038; G03F 9/7042; H01J 2237/335
  USPC .. 355/30, 40, 46, 50, 52, 53, 75–77, 78, 95, 355/85, 86; 430/5, 22, 30; 216/67; 134/1, 1.1, 1.2, 1.3; 250/492.1, 492.22, 250/493.1, 548
  See application file for complete search history.

(56) References Cited

U.S. PATENT DOCUMENTS

| | | | | |
|---|---|---|---|---|
| 2007/0259290 A1* | 11/2007 | Okita | ................... | G01N 21/956 430/312 |
| 2008/0267815 A1* | 10/2008 | Morishima | ............ | B82Y 10/00 422/24 |
| 2009/0305153 A1* | 12/2009 | Sakurai | ................... | B08B 3/024 430/30 |
| 2011/0037960 A1* | 2/2011 | Scaccabarozzi | .... | G03F 7/70925 355/30 |
| 2011/0198769 A1* | 8/2011 | Maeda | ................... | B82Y 10/00 264/40.5 |
| 2011/0285975 A1* | 11/2011 | Tawarayama | .............. | G03F 1/24 355/30 |
| 2013/0064415 A1* | 3/2013 | Ota | ......................... | G06T 7/001 382/100 |
| 2015/0015961 A1* | 1/2015 | Hayashi | ................. | C25D 11/18 359/601 |
| 2015/0323862 A1* | 11/2015 | Chang | ...................... | G03F 1/82 134/1.1 |
| 2016/0001492 A1* | 1/2016 | Yamaguchi | ........... | G03F 7/0002 264/39 |
| 2019/0061229 A1* | 2/2019 | Kokubo | ................ | B29C 59/002 |

FOREIGN PATENT DOCUMENTS

| | | |
|---|---|---|
| JP | 2015056589 A | 3/2015 |
| JP | 2017059641 A | 3/2017 |
| WO | 2017047002 A1 | 3/2017 |

* cited by examiner

CLEANING APPARATUS, IMPRINT APPARATUS, LITHOGRAPHY APPARATUS, AND CLEANING METHOD

BACKGROUND OF THE INVENTION

Field of the Invention

The present invention relates to a cleaning apparatus, an imprint apparatus, a lithography apparatus, and a cleaning method.

Description of the Related Art

As demand for the miniaturization of semiconductor devices increases, a micromachining technique for molding an uncured resin (imprinting material) on a substrate using a mold to form a resin pattern on the substrate has attracted attention, in addition to the photolithography techniques of the related art. Such a technique is also referred to as an imprinting technique and can be used to form a nanometer-order minute structure on a substrate.

One of imprinting techniques is, for example, a light curing method. In an imprint apparatus adopting a light curing method, first, a resin is supplied (coated) to a shot region (imprinting region) on a substrate. Subsequently, the resin is cured by irradiating the resin with light in a state where an uncured resin on a substrate and a mold are brought into contact with each other, and the mold is separated from the cured resin, thereby forming a pattern on the substrate.

Since the mold and the resin on the substrate are brought into contact with each other in the imprint apparatus, a cured material of the resin may remain in the mold. When an imprinting process is performed in a state where the cured material of the resin remains in the mold, the remaining resin is transferred as it is, and a defect (a fault or the like) may occur in the pattern formed on the substrate. Accordingly, the mold is required to be cleaned on a regular basis.

Several proposals have been made hitherto with respect to such a technique for cleaning a mold (Japanese Unexamined Patent Application Publication No. 2009-16434, Japanese Unexamined Patent Application Publication No. 2010-93245, Japanese Unexamined Patent Application Publication No. 2015-56589, and Japanese Unexamined Patent Application Publication No. 2017-59641). Japanese Unexamined Patent Application Publication No. 2009-16434 discloses a technique for removing foreign material using a plasma. Japanese Unexamined Patent Application Publication No. 2010-93245 discloses a technique in which a cleaning apparatus cleaning a member to be cleaned using a plasma is included within an exposure apparatus. Japanese Unexamined Patent Application Publication No. 2015-56589 discloses a technique for detecting foreign material attached to a mold and cleaning the mold in a case where foreign material is detected. Japanese Unexamined Patent Application Publication No. 2017-59641 discloses a technique for detecting foreign material on a mold and cleaning only a part to which foreign material is attached on the basis of the detection results.

However, since an alignment mark used for alignment of a mold and a substrate is disposed in the mold, and for example, chromium is used for the alignment mark, the alignment mark may disappear due to cleaning in the related art. In addition, when the strength of cleaning is lowered in order to prevent the alignment mark from disappearing, there is a possibility that an imprinting material remaining in the mold will not be able to be removed.

SUMMARY OF THE INVENTION

An object of the present invention is to provide a cleaning apparatus advantageous for cleaning, for example, an original plate used to transfer a pattern on a substrate.

According to the present invention, there is provided a cleaning apparatus that cleans an original plate used when a pattern is transferred to a substrate, the cleaning apparatus including a region dividing unit which divides the original plate into a plurality of regions on the basis of information of the original plate, a conditions generator which generates cleaning conditions for each of the separate regions, and a cleaner which cleans the original plate on the basis of the cleaning conditions.

Further features of the present invention will become apparent from the following description of exemplary embodiments with reference to the attached drawings.

DESCRIPTION OF THE EMBODIMENTS

Hereinafter, preferred embodiments of the present invention will be described with reference to the accompanying drawings. Meanwhile, in the drawings, the same members and components will be denoted by the same reference numerals and signs, and repeated description will be omitted. In the present embodiment, description will be given of an example in which the present invention is applied to a mold (original plate) used in an imprint apparatus that forms a pattern in an imprinting material on a substrate, but the present invention may be applied to, for example, a mask (original plate) used in an exposure apparatus that projects and transfers a pattern onto a substrate. In this manner, in the present invention, the original plate includes a mold which is used in an imprint apparatus or a mask which is used in an exposure apparatus.

First Embodiment

Figure 1:
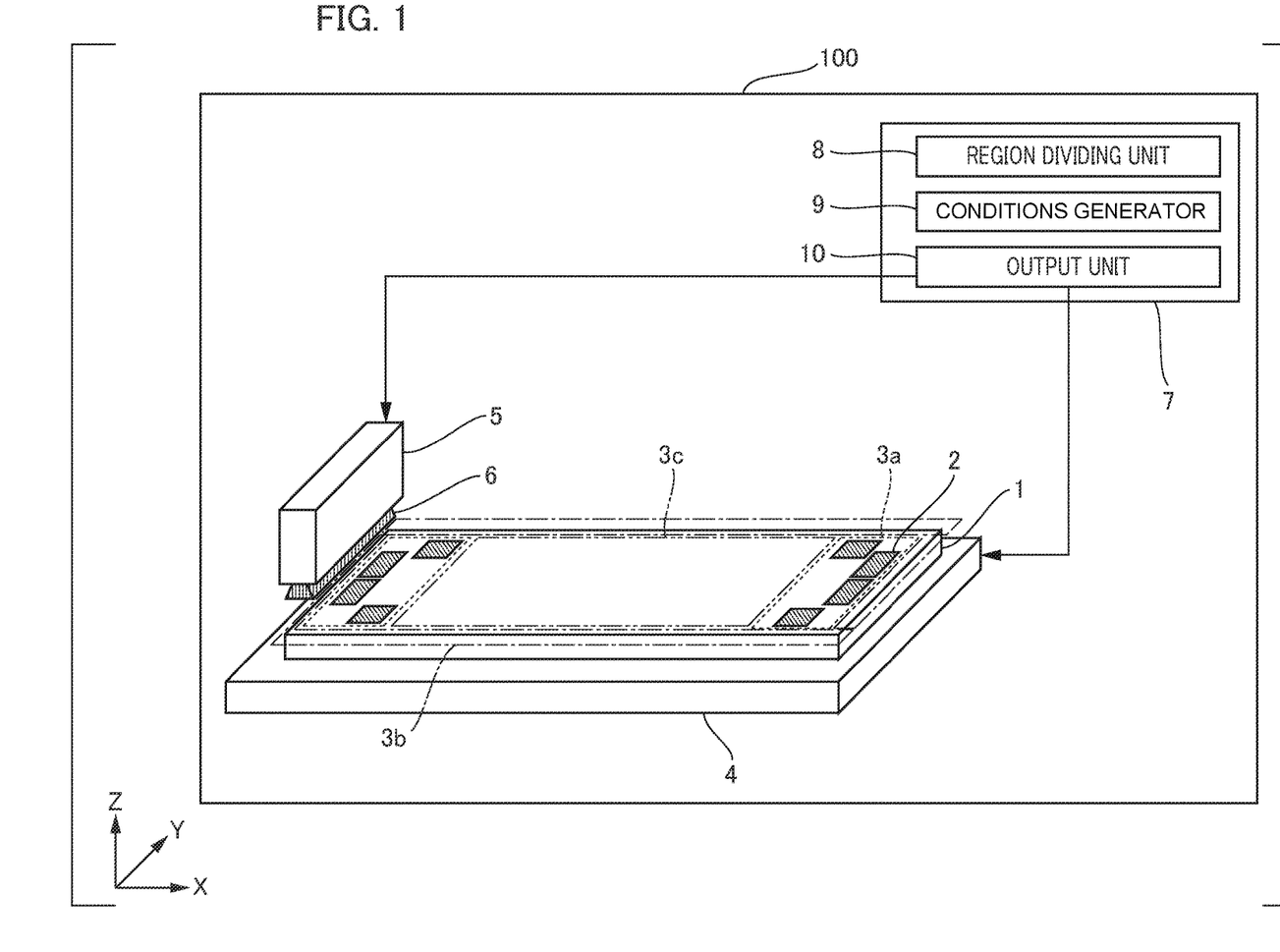
FIG. 1 is a schematic view illustrating a configuration of a cleaning apparatus according to a first embodiment.

FIG. 1 is a schematic view illustrating a configuration of a cleaning apparatus 100 according to a first embodiment. In the following drawing, description will be given by taking an X-axis and a Y-axis that are perpendicular to each other in a plane parallel to the surface of a mold and a Z-axis in a direction perpendicular to the X-axis and the Y-axis. The cleaning apparatus 100 includes a mold stage 4 holding the mold, a control unit 7, and a plasma head 5. The mold stage 4 holds the mold 1 and is driven.

Figure 2:
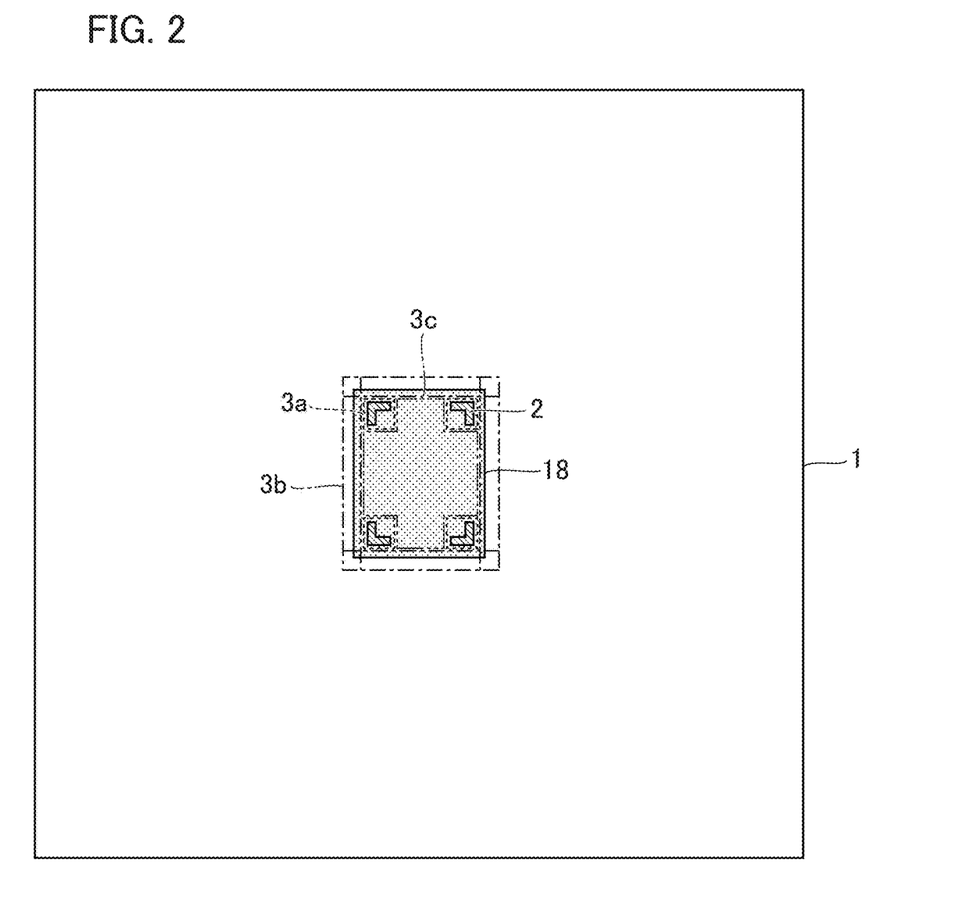
FIG. 2 is a schematic view illustrating an example of a mold.

For example, the mold 1 is used in an imprint apparatus that forms a pattern of an imprinting material on a substrate. FIG. 2 is a schematic view illustrating an example of the mold 1. Meanwhile, the mold 1 illustrated in this drawing is an example, and the mold 1 illustrated in FIG. 1 includes a mismatching portion. One surface of the mold 1 is provided with a pattern portion 18 in which an irregularities pattern for molding the imprinting material supplied on the substrate is formed three-dimensionally. The pattern portion 18 is also called a mesa and is formed in a convex portion of several tens of μm to several hundreds of μm so that portions other than the pattern portion 18 of the mold 1 are not in contact with the substrate. For this reason, a cured material of the imprinting material is likely to remain at the edge of the pattern portion 18 which is called a mesa edge, and the cured material of the imprinting material may accumulate when an imprinting process is repeated. In addition, the mold 1 includes a mark 2 used when alignment with a pattern (shot region) on the substrate is performed. The mark 2 is created according to the presence or absence of a chromium film on the surface of the mold 1 formed of, for example, quartz. In addition, the mark 2 may be a concave-convex structure formed in the mold 1, and a chromium film may be provided on the surfaces of a concave portion and a convex portion formed as a mark. The mark 2 is formed of, for example, a plurality of linear patterns. The mold 1 includes a region 3a in which the mark 2 is positioned, a region 3b in which the imprinting material is likely to be accumulated, and the other region 3c.

Referring back to FIG. 1, the control unit 7 includes, for example, a region dividing unit 8, a conditions generator 9, and an output unit 10. Information of the mold 1 (hereinafter, referred to as mold information) including positional information of the mark 2 provided in the mold 1 and the end of the pattern portion 18 is input to the region dividing unit 8. The region dividing unit 8 divides the mold 1 into a plurality of regions on the basis of the input mold information. The region dividing unit 8 divides the mold 1 into, for example, the region 3a in which the mark 2 is positioned, the region 3b in which the imprinting material is likely to accumulate, and the other region 3c. For example, the region dividing unit 8 may set a region in which the end of the pattern portion 18 is located to be the region 3b (mesa edge) in which the imprinting material is likely to accumulate or may set a region having a high density of an irregularities pattern in the pattern portion 18 to be the region 3b in which the imprinting material is likely to accumulate. In addition, the region 3b in which the imprinting material is likely to accumulate may be designated on the basis of past imprinting process data. In this manner, the mold information (information of the original plate) includes positional information of the end of the pattern portion, positional information of the mark, information of the density of the pattern portion, positional information of the region in which the imprinting material is likely to accumulate, and the like.

The conditions generator 9 generates cleaning conditions for the separate regions on the basis of the information which is input to the region dividing unit 8. Meanwhile, here, the cleaning conditions include the amount of irradiation with a plasma 6 emitted from a plasma head 5 to be described later and an irradiation time. When the region 3a in which the mark 2 is positioned is cleaned under cleaning conditions in which the degree of the strength of cleaning is high (a large amount of irradiation with a plasma and a long irradiation time), the mark 2 may be damaged due to the cleaning. Accordingly, the conditions generator 9 sets, for example, the strength of cleaning for the region 3a in which the mark 2 is positioned to be lower than those for the region 3b in which the imprinting material is likely to accumulate and the other region 3c (the amount of irradiation with a plasma is small and a short irradiation time). With such a configuration, it is possible to reduce damage to the mark 2. In addition, for example, the conditions generator 9 may set the strength of cleaning for the region 3b in which the imprinting material is likely to accumulate to be higher than the other region 3c. With such a configuration, it is possible to improve the rate of removal of the imprinting material accumulated in the mold 1 through cleaning.

The output unit 10 outputs a control instruction to the mold stage 4 and the plasma head 5 on the basis of the cleaning conditions generated in the conditions generator 9 to control the mold stage 4 and the plasma head 5. The output unit 10 outputs an instruction for controlling, for example, the amount of plasma 6 (the amount of irradiation and an irradiation time) which is generated from the plasma head 5 and the driving of the mold stage 4.

The plasma head 5 is a cleaner (cleaning device) that cleans the mold 1 on the basis of the cleaning conditions generated in the conditions generator 9 in a state where the mold 1 is held by the mold stage 4. The plasma head 5 cleans the regions 3a, 3b, and 3c of the mold 1 under the cleaning conditions for the respective regions. The plasma head 5 is movable with respect to the mold 1 held by the mold stage 4. The plasma head 5 generates the plasma 6 and relatively moves while irradiating the mold 1 with the plasma 6 to perform cleaning on the mold 1. In addition, the mold stage 4 may move with respect to the plasma head 5, and the mold stage 4 and the plasma head 5 may relatively move. The plasma head 5 is disposed at a position where the plasma head can face the mold 1. The plasma 6 emitted from the plasma head 5 is an atmospheric pressure plasma generated in atmospheric pressure, for example, using a high frequency power supply. It is possible to reduce costs by using the atmospheric pressure plasma.

Figure 3:
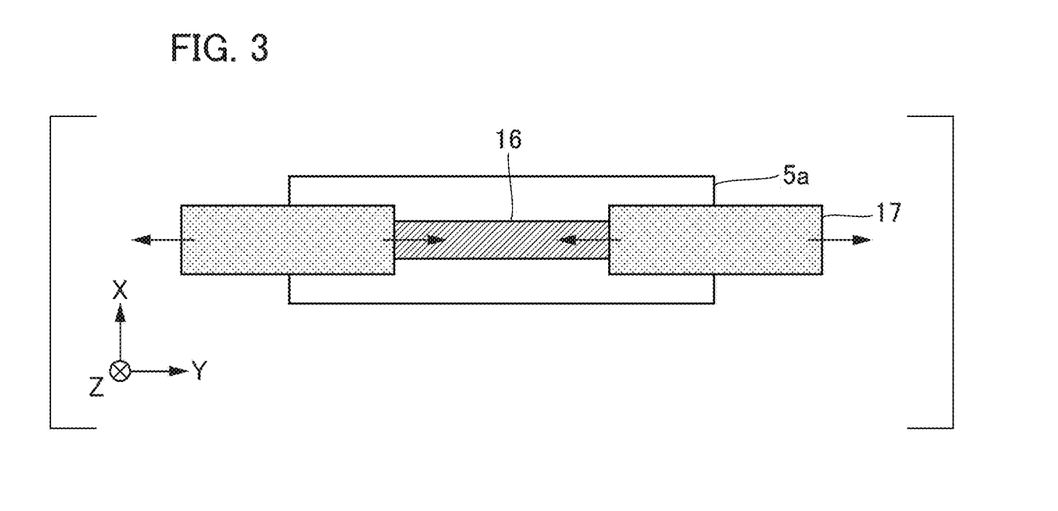
FIG. 3 is a schematic view illustrating an adjuster according to the first embodiment.

The plasma head 5 includes an adjuster that adjusts the width of irradiation with the plasma 6 in a direction (for example, a Y direction) perpendicular to the direction (for example, an X direction) of relative movement with respect to the mold 1 in a plane. FIG. 3 is a schematic view illustrating the adjuster according to the first embodiment. This drawing is a diagram when the plasma head 5 is seen from a −Z direction. The adjuster, which is, for example, a shutter 17, can adjust the width of irradiation with the plasma 6 by the shutter 17 moving to close an opening 16 for emitting the plasma 6. The shutter 17 may be controlled in response to a control instruction received from the output unit 10 on the basis of cleaning conditions. By including such an adjuster, it is possible to irradiate any region on the surface of the mold with a plasma and to flexibly cope with various cleaning conditions.

Figure 4:
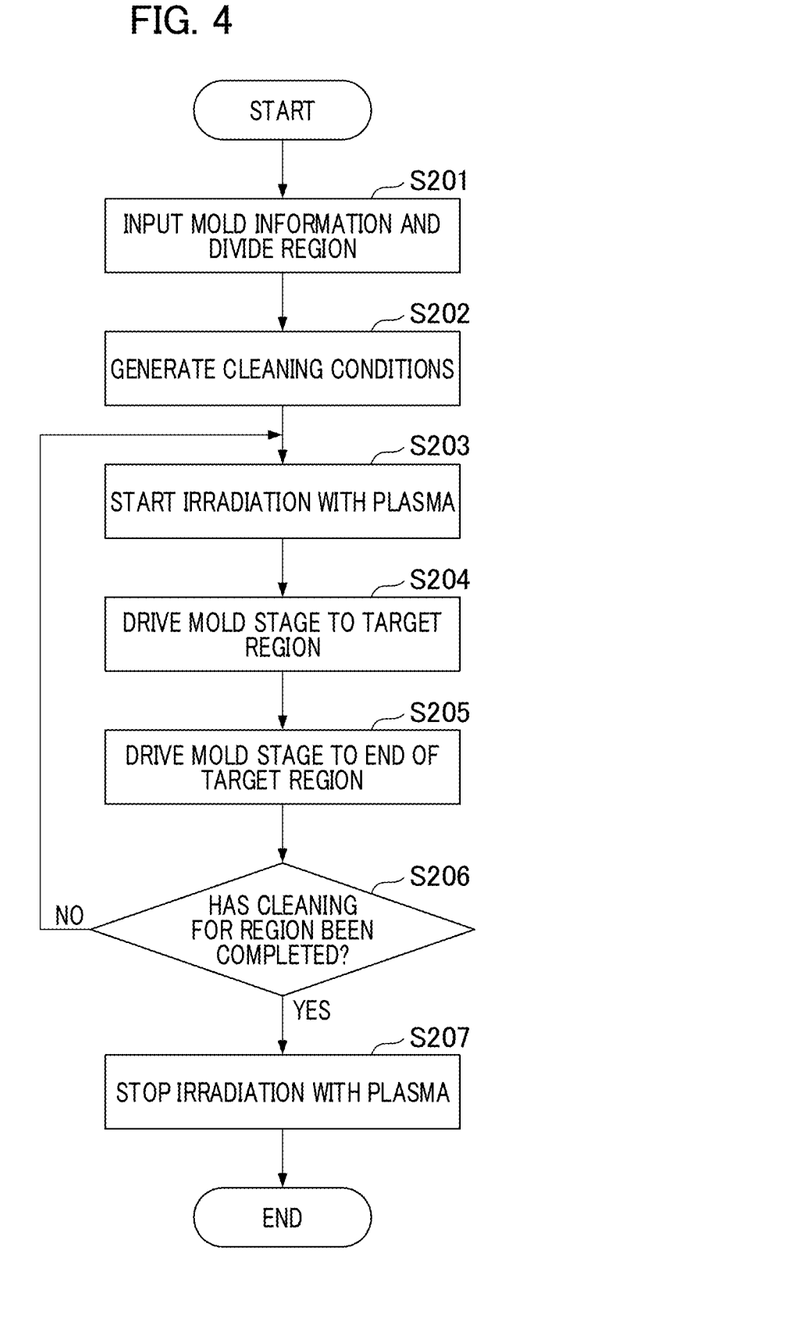
FIG. 4 is a flowchart of a cleaning process according to the first embodiment.

FIG. 4 is a flowchart of a process of cleaning the mold 1 using the cleaning apparatus 100 according to the first embodiment. Steps may be executed by the control unit 7 controlling the units of the cleaning apparatus 100. First, in S201, mold information is input to the region dividing unit 8. The input mold information includes, for example, positional information on the mark 2, positional information of the end of the pattern portion 18, information of a pattern density of the pattern portion 18, and the like.

In addition, the region dividing unit 8 divides the mold 1 into a plurality of regions on the basis of the input mold information. Meanwhile, the plurality of regions in this case may be designated from a graphic user interface (GUI) by a user. Next, in S202, cleaning conditions for each region are generated by the conditions generator 9 on the basis of the mold information which is input in S201. Step S203 and the subsequent steps are steps of cleaning. First, in S203, the plasma head 5 starts to perform irradiation with the plasma 6 having an amount of irradiation corresponding to a region to be cleaned (hereinafter, referred to as a target region) on the basis of the cleaning conditions generated in S202 in response to an instruction received from the output unit 10. Next, in S204, the mold stage 4 is driven to move the mold 1 to a position where an end of the target region and the opening 16 of the plasma head 5 face each other. Meanwhile, in this case, the plasma head 5 may be driven. In this case, the shutter 17 provided at the opening of the plasma head 5 is moved in accordance with the target region of the mold 1 before at least irradiation with a plasma is started.

Subsequently, in S205, the mold stage 4 is moved to a position where the other end of the target region and the opening 16 of the plasma head 5 face each other while irradiating the mold 1 with the plasma 6 emitted from the plasma head 5, and the irradiation of the entire surface of the target region with the plasma 6 is completed. In S206, it is determined whether or not the cleaning of all regions has been completed. In a case where it is determined that the cleaning of all regions has not been completed (NO), S203 to S205 are repeated on the next target region. In a case where it is determined that the cleaning of all regions has been completed (YES), the irradiation with the plasma is stopped in S207 to terminate the cleaning process. Meanwhile, even when it is determined in S206 that the cleaning of all regions has been completed, S203 to S205 may be repeated to perform cleaning again in order to further improve a cleaning effect. In the present embodiment, although a case where there are three sets of cleaning conditions has been described, cleaning conditions can be set arbitrarily, and it is possible to repeat the above-described cleaning process in accordance with at least the number of sets of cleaning conditions.

According to the above description, since cleaning can be performed under cleaning conditions different for each region of a mold, it is possible to efficiently remove foreign material such as an imprinting material accumulated in the mold while reducing damage to a mark provided in the mold.

Second Embodiment

Figure 5:
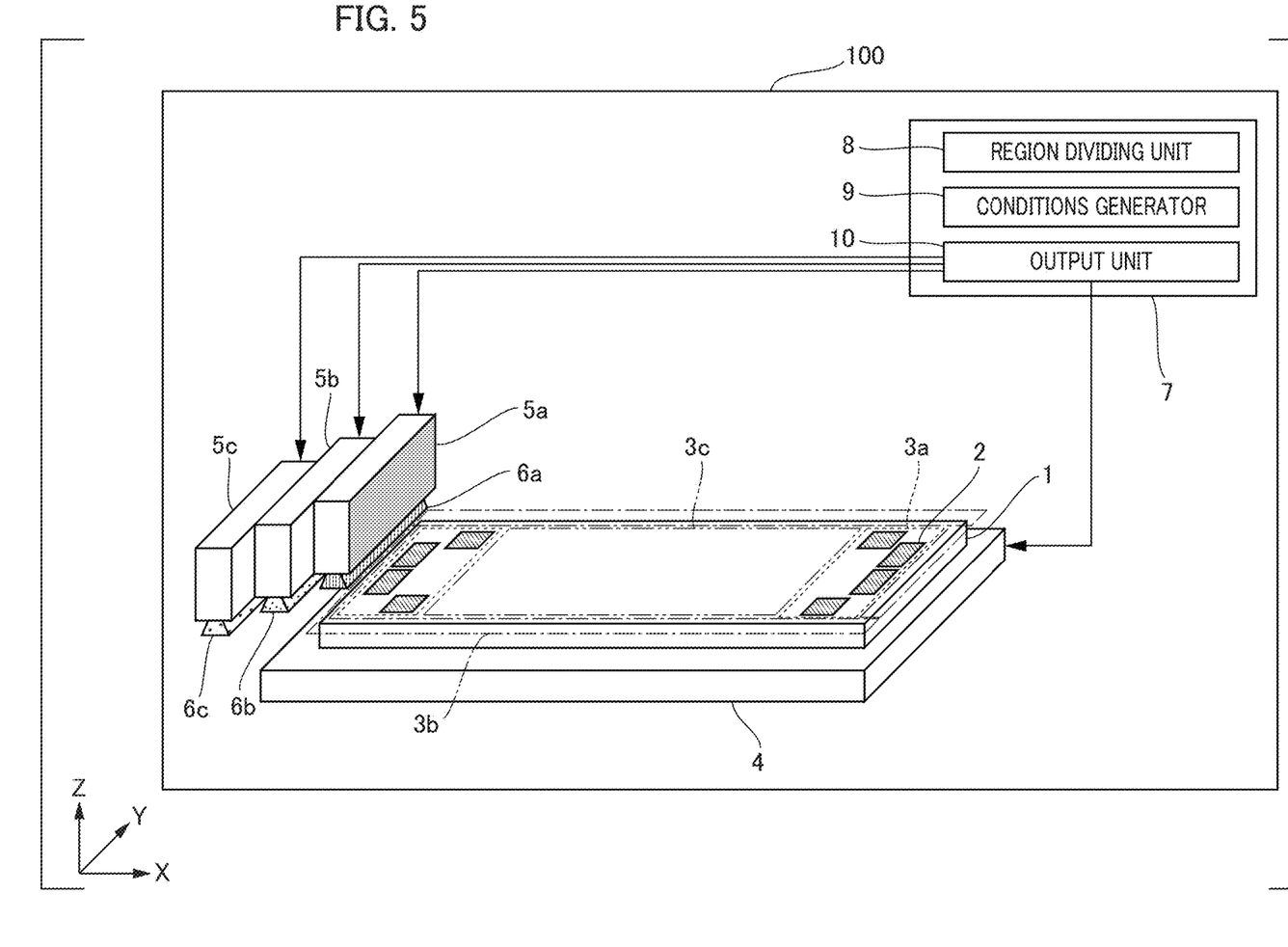
FIG. 5 is a schematic view illustrating a configuration of a cleaning apparatus according to a second embodiment.

FIG. 5 is a schematic view illustrating a configuration of a cleaning apparatus 100 according to a second embodiment. The cleaning apparatus 100 includes a plurality of plasma heads 5a, 5b, and 5c. The plasma heads 5a, 5b, and 5c irradiate corresponding regions 3a, 3b, and 3c with plasmas 6a, 6b, and 6c to clean the respective regions. In this case, the plasma heads 5a, 5b, and 5c and a mold stage 4 are controlled by a control unit 7. In the present embodiment, for example, the region 3a is irradiated with the plasma 6a by the plasma head 5a. The region 3b is irradiated with the plasma 6b by the plasma head 5b. The region 3c is irradiated with the plasma 6c by the plasma head 5c.

In a process of cleaning the mold 1 according to the present embodiment, for example, when the mold stage 4 is located at a position where an opening 16 of the plasma head 5a and the region 3a face each other, the plasma head 5a irradiates the region 3a with the plasma 6a. Thereby, the cleaning of the region 3a is performed. When the mold stage 4 is located at a position where the opening 16 of the plasma head 5b and the region 3b face each other, the plasma head 5b irradiates the region 3b with the plasma 6b to clean the region 3b. When the mold stage 4 is located at a position where the opening 16 of the plasma head 5c and the region 3c face each other, the plasma head 5c irradiates the region 3c with the plasma 6c to clean the region 3c. Meanwhile, in this case, when the mold stage 4 is located at a position where the openings 16 of the respective plasma heads 5a, 5b, and 5c do not face the corresponding regions 3a, 3b, and 3c, the plasma heads 5a, 5b, and 5c are set to be in a stopped state.

When cleaning of one region is completed and then cleaning of another region is performed in a case where there is one plasma head, it is necessary to change cleaning conditions. However, it is possible to clean a plurality of regions in parallel under a plurality of sets of cleaning conditions by including a plurality of plasma heads. Further, in a case where there is one plasma head, it is necessary to perform steps S203 to S205 of FIG. 4 on the regions 3a, 3b, and 3c in some cases, and the mold stage 4 has to be driven a plurality of times. However, in a case where a plurality of plasma heads are provided as in the present embodiment, steps S203 to S205 of FIG. 4 may be performed once, and it is possible to reduce a cleaning process time. In the present embodiment, although a case where there are three sets of cleaning conditions has been described, cleaning conditions can be set arbitrarily, and it is possible to complete the above-described cleaning process all at once by including at least plasma heads corresponding to the number of sets of cleaning conditions.

Embodiment of Imprint Apparatus

As an application example of the present invention, the cleaning apparatus 100 may be provided within an imprint apparatus. Although an example in which the present invention is applied to an imprint apparatus that forms a pattern in an imprinting material on a substrate has been described as an example in the present embodiment, the present invention can also be applied in a lithography apparatus such as an exposure apparatus exposing a substrate or a drawing apparatus.

Figure 6:
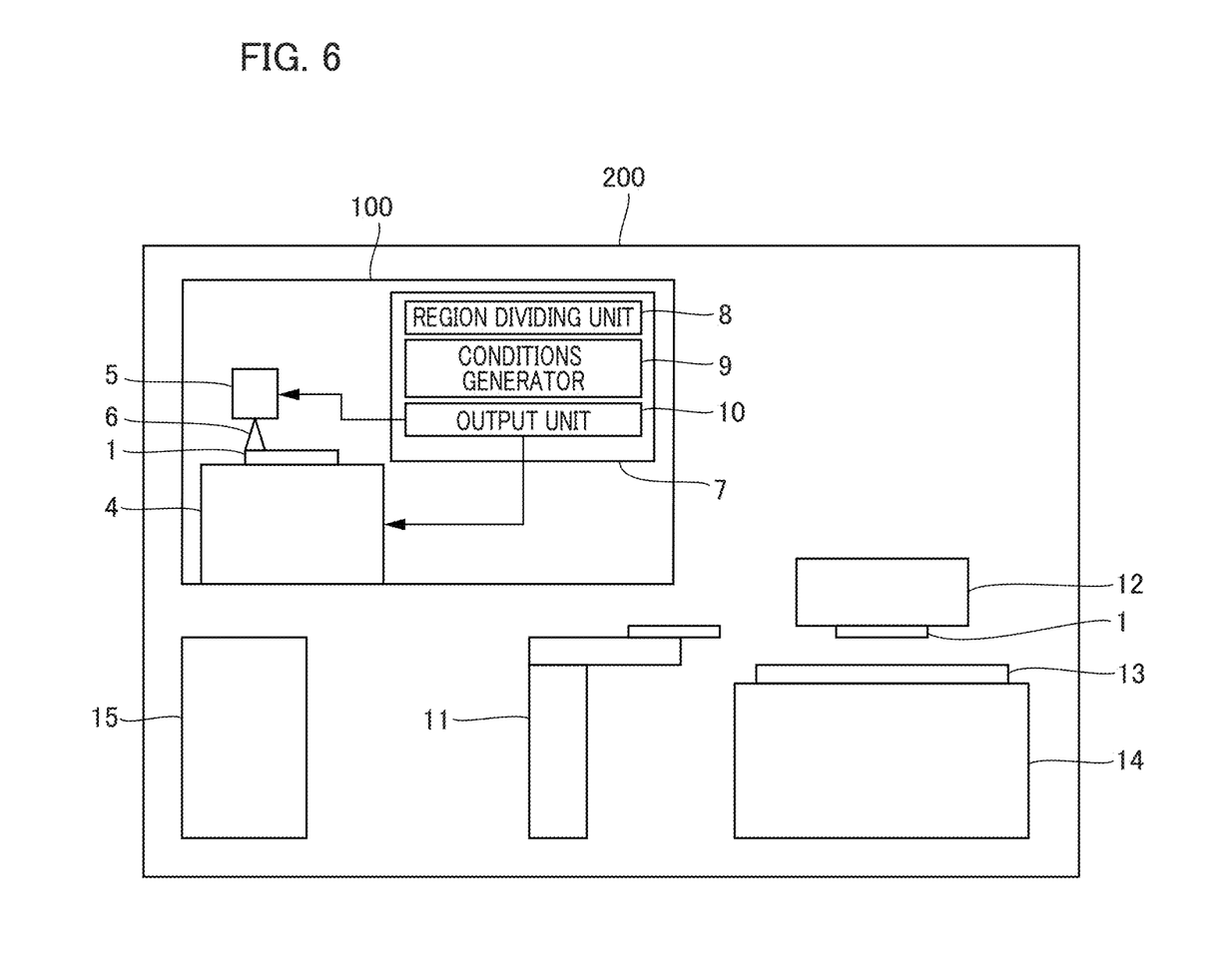
FIG. 6 is a schematic view illustrating a configuration of an imprint apparatus to which the cleaning apparatus is applied.

FIG. 6 is a schematic view illustrating a configuration of an imprint apparatus 200 to which the cleaning apparatus 100 is applied. The imprint apparatus 200 is an apparatus that forms a pattern of an imprinting material using a mold on a substrate. The imprint apparatus 200 includes a mold holding unit 12 that holds and moves the mold 1, a substrate stage 14 that holds and moves a substrate 13, a transport unit 11 that transports the mold 1, a recoverer 15, and the cleaning apparatus 100.

The recoverer 15 (recovering unit) recovers gases generated by the cleaning apparatus 100 cleaning the mold 1, and particularly, a gas which is an obstacle to an imprinting process. However, in a case where a gas which is an obstacle to an imprinting process is not generated and the cleaning apparatus 100 is used independently of the imprint apparatus 200, the recoverer 15 is not necessarily an essential component.

Although a configuration of the cleaning apparatus 100 according to the present embodiment is the same as that in the above-described embodiment, a threshold value of the number of times the mold 1 to be cleaned is used may be input as mold information to be input to the region dividing unit 8. In this case, for example, in a case where the number of times the mold 1 is used within the imprint apparatus 200 exceeds the threshold value, an instruction for executing cleaning is output by the output unit 10, so that the cleaning of the mold 1 is executed. In addition, a threshold value of a period of use for executing cleaning may be input as mold information. In this case, for example, in a case where a period in which the mold 1 has been held by the mold holding unit 12 within the imprint apparatus 200 exceeds a threshold value, an instruction for executing cleaning is output by the output unit 10, so that the cleaning of the mold 1 is executed. In addition, when a plurality of molds 1 can be stored in the imprint apparatus 200, an imprinting process may be performed using other molds in parallel with the cleaning of the molds.

Since a transport distance of the mold 1 is reduced by providing the cleaning apparatus 100 within the imprint apparatus 200, it is possible to reduce a cleaning process time.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-136926, filed Jul. 20, 2018, which is hereby incorporated by reference wherein in its entirety.

What is claimed is:

1. A cleaning apparatus that cleans a mold for forming a pattern in an imprinting material on a substrate, the cleaning apparatus comprising:
   a region dividing unit configured to divide the mold into a plurality of regions on the basis of a position of a mark to be used when alignment with the substrate is performed;
   a conditions generator configured to generate cleaning conditions for each of the plurality of regions such that a first cleaning condition is generated for a first region among the plurality of regions and a second cleaning condition different from the first cleaning condition is generated for a second region different from the first region among the plurality of regions; and
   a cleaner configured to clean the first region of the mold on the basis of the first cleaning condition and to clean the second region of the mold on the basis of the second cleaning condition different from the first cleaning condition,
   wherein the conditions generator is configured to set a strength of cleaning for a region among the plurality of regions in which the mark is positioned to be lower than strengths of cleaning for other regions among the plurality of regions.

2. The cleaning apparatus according to claim 1, wherein the mold includes a pattern portion, and
   the region dividing unit is further configured to divide the mold into the plurality of regions on the basis of a density of a pattern formed in the pattern portion or a position of an end of the pattern portion.

3. The cleaning apparatus according to claim 1, wherein the cleaner is configured to perform the cleaning using a plasma.

4. The cleaning apparatus according to claim 3, wherein the plasma is an atmospheric pressure plasma generated in atmospheric pressure.

5. The cleaning apparatus according to claim 1, further comprising a recovering unit configured to recover a gas generated due to the cleaning.

6. The cleaning apparatus according to claim 1, wherein the information of the mold is input to the region dividing unit.

7. The cleaning apparatus according to claim 1, further comprising:
   an output unit configured to output a control instruction to the cleaner,
   wherein the output unit is configured to output an instruction for executing cleaning to the cleaner in a case where a number of times that the mold is used exceeds a threshold value.

8. The cleaning apparatus according to claim 1, further comprising:
   an output unit configured to output a control instruction to the cleaner,
   wherein the output unit is configured to output an instruction for executing cleaning to the cleaner in a case where a period of use of the mold exceeds a threshold value.

9. A cleaning apparatus that cleans a mold including a pattern portion for forming a pattern in an imprinting material on the substrate, the cleaning apparatus comprising:
   a region dividing unit configured to divide the mold into a plurality of regions on the basis of a density of a pattern formed in the pattern portion or a position of an end of the pattern portion;
   a conditions generator configured to generate cleaning conditions for each of the plurality of regions such that a first cleaning condition is generated for a first region among the plurality of regions and a second cleaning condition different from the first cleaning condition is generated for a second region different from the first region among the plurality of regions; and
   a cleaner configured to clean the first region of the mold on the basis of the first cleaning condition and to clean the second region of the mold on the basis of the second cleaning condition different from the first cleaning condition,
   wherein the pattern portion formed in the mold has a convex shape with respect to the vicinity of the pattern portion; and
   the conditions generator is configured to set a strength of cleaning for a region among the plurality of regions in which the end of the pattern portion is positioned to be higher than strengths of cleaning for other regions among the plurality of regions.

10. A cleaning apparatus that cleans an original plate used when a pattern is transferred to a substrate, the cleaning apparatus comprising:
    a region dividing unit configured to divide the original plate into a plurality of regions on the basis of information of the original plate;
    a conditions generator configured to generate cleaning conditions for each of the plurality of regions such that a first cleaning condition is generated for a first region among the plurality of regions and a second cleaning condition different from the first cleaning condition is generated for a second region different from the first region among the plurality of regions; and
    a cleaner configured to clean the first region of the original plate on the basis of the first cleaning condition and to clean the second region of the original plate on the basis of the second cleaning condition different from the first cleaning condition,
    wherein the cleaner is configured to perform the cleaning using a plasma and includes an adjuster configured to relatively move while irradiating the original plate with the plasma to perform cleaning on the original plate and to adjust a width of irradiation with the plasma in a direction perpendicular to the moving direction in a plane.

11. The cleaning apparatus according to claim 10, wherein the original plate is a mask configured to project and transfer a pattern onto the substrate.

12. An imprint apparatus for forming a pattern in an imprinting material on a substrate using a mold, the imprint apparatus comprising:
   a cleaning apparatus configured to clean the mold, wherein the cleaning apparatus includes:
   a region dividing unit configured to divide the mold into a plurality of regions on the basis of a position of a mark to be used when alignment with the substrate is performed,
   a conditions generator configured to generate cleaning conditions for each of the plurality of regions such that a first cleaning condition is generated for a first region among the plurality of regions and a second cleaning condition different from the first cleaning condition is generated for a second region different from the first region among the plurality of regions, and
   a cleaner configured to clean the first region of the mold on the basis of the first cleaning condition and to clean the second region of the mold on the basis of the second cleaning condition different from the first cleaning condition,
   wherein the conditions generator is configured to set a strength of cleaning for a region among the plurality of regions in which the mark is positioned to be lower than strengths of cleaning for other regions among the plurality of regions.

13. A lithography apparatus that transfers a pattern to a substrate using a mask, the lithography apparatus comprising:
   a cleaning apparatus configured to clean the mask, wherein the cleaning apparatus includes:
   a region dividing unit configured to divide the mask into a plurality of regions on the basis of a position of a mark to be used when alignment with the substrate is performed,
   a conditions generator configured to generate cleaning conditions for each of the plurality of regions such that a first cleaning condition is generated for a first region among the plurality of regions and a second cleaning condition different from the first cleaning condition is generated for a second region different from the first region among the plurality of regions, and
   a cleaner configured to clean the first region of the mask on the basis of the first cleaning condition and to clean the second region of the mask on the basis of the second cleaning condition different from the first cleaning condition,
   wherein the conditions generator is configured to set a strength of cleaning for a region among the plurality of regions in which the mark is positioned to be lower than strengths of cleaning for other regions among the plurality of regions.

14. A cleaning method of cleaning a mold for forming a pattern in an imprinting material on a substrate, the cleaning method comprising:
   dividing the mold into a plurality of regions on the basis of a position of a mark to be used when alignment with the substrate is performed;
   generating cleaning conditions for each of the plurality of regions such that a first cleaning condition is generated for a first region among the plurality of regions and a second cleaning condition different from the first cleaning condition is generated for a second region different from the first region among the plurality of regions; and
   cleaning the first region of the mold on the basis of the first cleaning condition and cleaning the second region of the mold on the basis of the second cleaning condition different from the first cleaning condition,
   wherein in the generating the cleaning conditions, a strength of cleaning for a region among the plurality of regions in which the mark is positioned is set to be lower than strengths of cleaning for other regions among the plurality of regions.

* * * * *